United States Patent
Gathman et al.

(10) Patent No.: US 10,305,517 B1
(45) Date of Patent: May 28, 2019

(54) CURRENT-MODE FILTERING WITH SWITCHING

(71) Applicant: Qualcomm Incorporated, San Diego, CA (US)

(72) Inventors: Timothy Donald Gathman, San Diego, CA (US); Chirag Dipak Patel, San Diego, CA (US); Lai Kan Leung, San Marcos, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/028,247

(22) Filed: Jul. 5, 2018

(51) Int. Cl.
*H04B 1/00* (2006.01)
*H04B 1/10* (2006.01)
*H03H 11/04* (2006.01)

(52) U.S. Cl.
CPC ............ *H04B 1/005* (2013.01); *H03H 11/04* (2013.01); *H04B 1/10* (2013.01); *H03H 2011/0488* (2013.01); *H04B 1/0067* (2013.01); *H04B 2001/1063* (2013.01)

(58) Field of Classification Search
CPC ........ H04B 1/005–1/0096; H04B 1/10–1/109; H03H 11/04–11/54; H03H 2011/0477–2011/0494; H03H 21/00–21/0007
See application file for complete search history.

(56) References Cited

U.S. PATENT DOCUMENTS

| | | | | |
|---|---|---|---|---|
| 4,215,344 A | * | 7/1980 | Phillips, Jr. | ............... G01S 7/36 342/17 |
| 5,793,244 A | * | 8/1998 | Ueda | ...................... G01R 23/16 327/350 |
| 5,963,112 A | * | 10/1999 | Moschytz | ............ H03H 11/126 327/552 |
| 6,252,474 B1 | * | 6/2001 | Mizutani | ................ H03H 11/20 333/139 |
| 7,948,309 B2 | | 5/2011 | Mak et al. | |

(Continued)

OTHER PUBLICATIONS

Chen R., et al., "Reconfigurable Receiver with Radio-Frequency Current-Mode Complex Signal Processing Supporting Carrier Aggregation", IEEE Journal of Solid-State Circuits, vol. 50, No. 12, Dec. 2015, pp. 3032-3046.

(Continued)

*Primary Examiner* — Duc M Nguyen
(74) *Attorney, Agent, or Firm* — Colby Nipper/Qualcomm

(57) ABSTRACT

An apparatus is disclosed for current-mode filtering with switching. In an example aspect, the apparatus includes a filter including two input nodes, two output nodes, two differential paths, two bypass nodes respectively coupled between the two input nodes and the two output nodes along the two differential paths, a high-pass filter coupled between the two bypass nodes and the two output nodes, two low-pass switches, a band-pass switch, and a low-pass filter coupled in series with the high-pass filter along the two differential paths. The high-pass filter includes two series capacitors, which are respectively coupled between the two bypass nodes and the two output nodes, and two shunt inductors, which are respectively coupled to the two bypass nodes. The two low-pass switches are respectively coupled in parallel with the two series capacitors. The band-pass switch is coupled in series between the two shunt inductors.

28 Claims, 10 Drawing Sheets

(56) References Cited

U.S. PATENT DOCUMENTS

| | | | | |
|---|---|---|---|---|
| 8,666,326 B2* | 3/2014 | Chien | ............... | H03H 11/1291 |
| | | | | 455/73 |
| 8,798,570 B2 | 8/2014 | Fahim et al. | | |
| 9,374,053 B2 | 6/2016 | Jussila et al. | | |
| 2006/0009177 A1* | 1/2006 | Persico | ................. | H04B 1/109 |
| | | | | 455/143 |
| 2006/0126702 A1* | 6/2006 | Burdett | ................... | H04B 1/26 |
| | | | | 375/136 |
| 2007/0054628 A1* | 3/2007 | Rowe | ...................... | H04B 1/28 |
| | | | | 455/78 |
| 2007/0092038 A1* | 4/2007 | Li | ..................... | H03H 11/1291 |
| | | | | 375/322 |
| 2014/0369452 A1* | 12/2014 | Dubash | .................... | G01S 5/00 |
| | | | | 375/350 |
| 2016/0015286 A1* | 1/2016 | Gitlin | ................ | A61B 5/04011 |
| | | | | 600/512 |
| 2017/0237452 A1* | 8/2017 | Granger-Jones | ..... | H04B 1/0057 |
| | | | | 370/297 |
| 2018/0048293 A1* | 2/2018 | Gathman | ............ | H03H 11/126 |

OTHER PUBLICATIONS

Zhang X., et al., "An Interference-Robust Reconfigurable Receiver with Automatic Frequency-Calibrated LNA in 65-nm CMOS", IEEE Transactions on Very Large Scale Integration (VLSI) Systems, Nov. 2017, vol. 25, No. 11, pp. 3113-3124.

* cited by examiner

CURRENT-MODE FILTERING WITH SWITCHING

TECHNICAL FIELD

This disclosure relates generally to wireless transceivers and, more specifically, to a hybrid current-mode filter capable of switching between a low-pass response or a band-pass response for passing different types of signals.

BACKGROUND

Increased data rates and network capacities are challenging to realize. One such challenge involves the segmented nature of the frequency spectrum. In particular, a network provider may be allocated several non-contiguous sections of the frequency spectrum, which may be interleaved between allocations of other network providers. Due to this interleaving, some of the frequency spectrum allocations may have wide bandwidths while others have narrow bandwidths. Because a quantity of wide-bandwidth allocations may be limited, opportunities for fifth generation (5G)-capable devices to realize increased data rates through use of larger bandwidths may be constrained. To make use of narrow-bandwidth allocations, carrier aggregation may be used to combine the non-contiguous sections of the frequency spectrum to increase data rates. However, network providers with interspersed frequency spectrums may interfere with one another, thereby degrading communication performance.

SUMMARY

An apparatus is disclosed that implements current-mode filtering with switching. The described techniques implement a hybrid current-mode filter, which is reconfigurable to have different filter responses to support wideband communications, such as fifth generation (5G) mode, narrowband communications, or carrier aggregation (CA). The hybrid current-mode filter comprises a low-pass filter, a high-pass filter, and switch circuitry. The switch circuitry enables the hybrid current-mode filter to act as a low-pass filter for passing narrowband signals or wideband signals. The switch circuitry also enables the hybrid current-mode filter to act as a band-pass filter for passing non-contiguous signals and attenuating jammers between the non-contiguous signals. Characteristics of the different filter responses are also adjustable to enable the hybrid current-mode filter to support frequency allocations for different network providers, different continents, and for different frequency bands. Through use of the hybrid current-mode filter, a single receiver can process a variety of different types of signals, thereby conserving space and reducing cost of a wireless communication device.

In an example aspect, an apparatus is disclosed. The apparatus includes a filter including two input nodes, two output nodes, two differential paths respectively coupled between the two input nodes and the two output nodes, two bypass nodes respectively coupled between the two input nodes and the two output nodes along the two differential paths, a high-pass filter coupled between the two bypass nodes and the two output nodes, two low-pass switches, at least one band-pass switch, and a low-pass filter. The high-pass filter includes two series capacitors and at least one shunt inductor. The two series capacitors are respectively coupled between the two bypass nodes and the two output nodes. The two low-pass switches are respectively coupled in parallel with the two series capacitors between the two bypass nodes and the two output nodes. The at least one band-pass switch is coupled in series with the at least one shunt inductor between the two bypass nodes. The low-pass filter is coupled in series with the high-pass filter along the two differential paths.

In an example aspect, an apparatus is disclosed. The apparatus includes a filter including two input nodes, two output nodes, and two differential paths respectively coupled between the two input nodes and the two output nodes. The two input nodes are configured to accept a first input current associated with at least a first signal at a first time and accept a second input current associated with at least a second signals at a second time. The apparatus also includes filter means for providing a low-pass response to pass the first signal along the two differential paths from the two input nodes to the two output nodes at the first time and providing a band-pass response to pass the second signal along the two differential paths from the two input nodes to the two output nodes at the second time.

In an example aspect, a method for current-mode filtering with switching is disclosed. The method includes accepting an input current at two input nodes at a first time. The input current is associated with at least a first signal and the two input nodes are respectively coupled to the two output nodes via two differential paths. The method also includes passing the first signal along the two differential paths to the two output nodes at the first time using a low-pass response. The method additionally includes accepting another input current at the two input nodes at a second time. The output input current is associated with at least a second signal and a jammer. The jammer has a frequency that is lower than a frequency of the second signal. The method includes attenuating the jammer using a band-pass response and passing the second signal along the two differential paths to the two output nodes at the second time using the band-pass response.

In an example aspect, an apparatus is disclosed. The apparatus includes an antenna and a receiver. The receiver includes a low-noise amplifier coupled to the antenna, a mixer coupled to the low-noise amplifier, an analog-to-digital converter, and a filter. The filter includes two input nodes coupled to the mixer and two output nodes coupled to the analog-to-digital converter. The filter is configured to have a low-pass response at a first time and a band-pass response at a second time.

BRIEF DESCRIPTION OF DRAWINGS

FIG. 3-1 illustrates example low-pass responses of a hybrid current-mode filter for current-mode filtering with switching.

FIG. 3-2 illustrates example band-pass responses of a hybrid current-mode filter for current-mode filtering with switching.

FIG. 3-3 illustrates other example responses of a hybrid current-mode filter for current-mode filtering with switching.

DETAILED DESCRIPTION

Increased data rates and network capacities are challenging to realize due to the segmented nature of the frequency spectrum. Some electronic devices use multiple receivers, which are design for a particular bandwidth. For example, a wideband receiver may be used to receive wideband signals for fifth-generation (5G) wireless communications and multiple narrowband receivers may be used to respectively receive narrowband signals for non-contiguous carrier aggregation (NCCA). These multiple receivers, however, utilize bandwidth-specific components, such as filters, which increase area and cost of an electronic device as the bandwidth-specific components are included in multiple instances. Additionally, utilizing multiple local oscillators for performing non-contiguous carrier aggregation creates intermodulation distortion or second harmonic distortion, which can decrease sensitivity and degrade a signal-to-noise ratio.

In contrast, techniques for current-mode filtering with switching are described herein. The described techniques implement a hybrid current-mode filter, which is reconfigurable to have different filter responses to support wideband communications, such as a 5G mode, narrowband communications, or carrier aggregation (CA). The hybrid current-mode filter comprises a low-pass filter, a high-pass filter, and switch circuitry. The switch circuitry enables the hybrid current-mode filter to act as a low-pass filter for passing narrowband signals or wideband signals. The switch circuitry also enables the hybrid current-mode filter to act as a band-pass filter for passing non-contiguous signals and attenuating jammers between the non-contiguous signals. Characteristics of the different filter responses are also adjustable, to enable the hybrid current-mode filter to support frequency allocations for different network providers, different continents, and for different frequency bands. Through use of the hybrid current-mode filter, a single receiver can process a variety of different types of signals, thereby conserving space and reducing cost of a wireless communication device.

Figure 1:
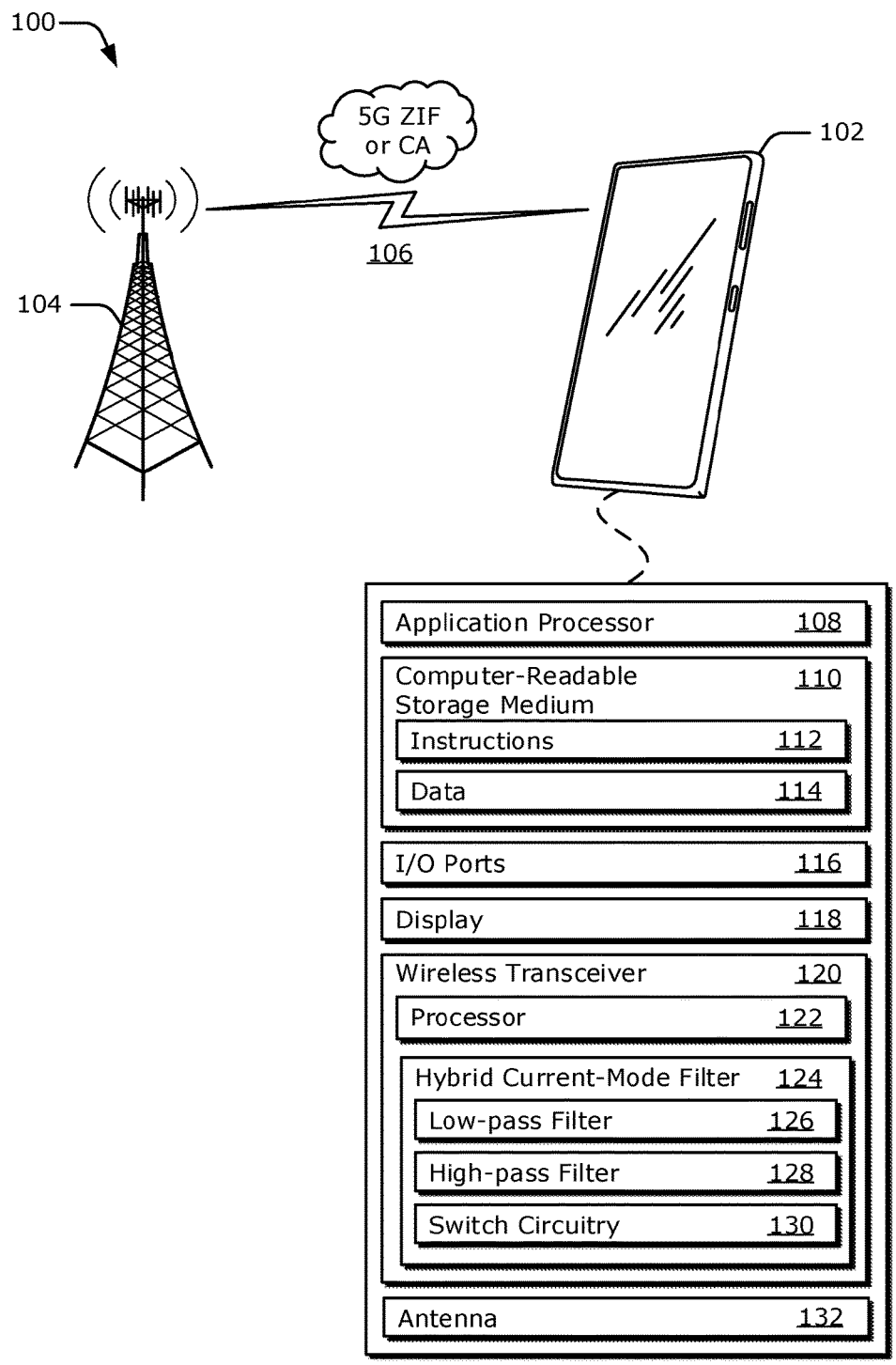
FIG. 1 illustrates an example environment for current-mode filtering with switching.

FIG. 1 illustrates an example environment 100 for current-mode filtering with switching. In the example environment 100, a computing device 102 communicates with a base station 104 through a wireless communication link 106 (wireless link 106). In this example, the computing device 102 is implemented as a smart phone. However, the computing device 102 may be implemented as any suitable computing or electronic device, such as a modem, cellular base station, broadband router, access point, cellular phone, gaming device, navigation device, media device, laptop computer, desktop computer, tablet computer, wearable computer, server, network-attached storage (NAS) device, smart appliance or other internet of things (IoT) device, medical device, vehicle-based communication system, radar, radio apparatus, and so forth.

The base station 104 communicates with the computing device 102 via the wireless link 106, which may be implemented as any suitable type of wireless link. Although depicted as a tower of a cellular network, the base station 104 may represent or be implemented as another device, such as a satellite, cable television head-end, terrestrial television broadcast tower, access point, peer-to-peer device, mesh network node, fiber optic line, and so forth. Therefore, the computing device 102 may communicate with the base station 104 or another device via a wired connection, a wireless connection, or a combination thereof.

The wireless link 106 can include a downlink of data or control information communicated from the base station 104 to the computing device 102, or an uplink of other data or control information communicated from the computing device 102 to the base station 104. The wireless link 106 may be implemented using any suitable communication protocol or standard, such as $2^{nd}$ Generation (2G), $3^{rd}$ Generation (3G), $4^{th}$ Generation (4G), 5G, IEEE 802.11, IEEE 802.16, Bluetooth™, and so forth. The wireless link 106 may also be implemented using carrier aggregation (CA) (contiguous or non-contiguous) to increase data rates and improve network performance. In some implementations, instead of or in addition to providing a data link, the wireless link 106 may wirelessly provide power and the base station 104 may comprise a power source.

The computing device 102 includes an application processor 108 and a computer-readable storage medium 110 (CRM 110). The application processor 108 may include any type of processor, such as a multi-core processor, that executes processor-executable code stored by the CRM 110. The CRM 110 may include any suitable type of data storage media, such as volatile memory (e.g., random access memory (RAM)), non-volatile memory (e.g., Flash memory), optical media, magnetic media (e.g., disk), and so forth. In the context of this disclosure, the CRM 110 is implemented to store instructions 112, data 114, and other information of the computing device 102, and thus does not include transitory propagating signals or carrier waves.

The computing device 102 may also include input/output ports 116 (I/O ports 116) and a display 118. The I/O ports 116 enable data exchanges or interaction with other devices, networks, or users. The I/O ports 116 may include serial ports (e.g., universal serial bus (USB) ports), parallel ports, audio ports, infrared (IR) ports, and so forth. The display 118 presents graphics of the computing device 102, such as a user interface associated with an operating system, program, or application. Alternately or additionally, the display 118 may be implemented as a display port or virtual interface, through which graphical content of the computing device 102 is presented.

A wireless transceiver 120 of the computing device 102 provides connectivity to respective networks and other electronic devices connected therewith. Alternately or additionally, the computing device 102 may include a wired transceiver, such as an Ethernet or fiber optic interface for communicating over a local network, intranet, or the Internet. The wireless transceiver 120 may facilitate communication over any suitable type of wireless network, such as a wireless LAN (WLAN), peer-to-peer (P2P) network, mesh network, cellular network, wireless wide-area-network (WWAN), and/or wireless personal-area-network (WPAN). In the context of the example environment 100, the wireless transceiver 120 enables the computing device 102 to communicate with the base station 104 and networks connected therewith.

The wireless transceiver 120 includes circuitry and logic for transmitting and receiving communication signals via an antenna 132. Components of the wireless transceiver 120 can include amplifiers, switches, mixers, analog-to-digital converters, filters, and so forth for conditioning the communication signals. The wireless transceiver 120 may also include logic to perform in-phase/quadrature (I/Q) operations, such as synthesis, encoding, modulation, decoding, demodulation, and so forth. In some cases, components of the wireless transceiver 120 are implemented as separate receiver and transmitter entities. Additionally or alternatively, the wireless transceiver 120 can be realized using multiple or different sections to implement respective receiving and transmitting operations (e.g., separate transmit and receiver chains). In general, the wireless transceiver 120 processes data and/or signals associated with communicating data of the computing device 102 over the antenna 132.

The wireless transceiver 120 includes a processor 122 and a hybrid current-mode filter 124. The processor 122, which can be implemented as a modem, controls the wireless transceiver 120 and enables wireless communication to be performed. The processor 122, which is shown as implemented within the wireless transceiver 120, can alternatively be implemented separate from the wireless transceiver 120. Although not explicitly shown, the processor 122 can include a portion of the CRM 110 or can access the CRM 110 to obtain computer-readable instructions. The processor 122 can include baseband circuitry to perform high-rate sampling processes that can include analog-to-digital conversion, digital-to-analog conversion, gain correction, skew correction, frequency translation, and so forth. The processor 122 can provide communication data to the wireless transceiver 120 for transmission. The processor 122 can also process a baseband version of a signal accepted from the wireless transceiver 120 to generate data, which can be provided to other parts of the computing device 102 via a communication interface for wireless communication or proximity detection.

The wireless transceiver 120 can also include a controller (not shown). The controller can include at least one processor and CRM, which stores computer-executable instructions (such as the application processor 108, the CRM 110, and the instructions 112). The processor and the CRM can be localized at one module or one integrated circuit chip or can be distributed across multiple modules or chips. Together, a processor and associated instructions can be realized in separate circuitry, fixed logic circuitry, hard-coded logic, and so forth. The controller can be implemented as part of the wireless transceiver 120, the processor 122, the application processor 108, a general-purpose processor, some combination thereof, and so forth.

The hybrid current-mode filter 124 comprises a reconfigurable baseband filter that can have a variety of different filter responses, including a low-pass response and a band-pass response. Based on these responses, the hybrid current-mode filter 124 can pass a variety of different signals, including wideband signals (e.g., those used for 5G modes), narrowband signals, or signals used for carrier aggregation. Each signal is associated with a frequency channel and includes multiple frequencies based on a center frequency and a bandwidth of the signal. The narrowband signals may have narrow bandwidths on the order of tens of megahertz (MHz) to hundreds of megahertz (e.g., less than approximately 400 MHz or between approximately 10 MHz and 400 MHz). In comparison, the wideband signals may have wide bandwidths on the order of hundreds of megahertz (MHz) or a few gigahertz (GHz) (e.g., greater than approximately 400 MHz or between approximately 400 MHz and 4 GHz). Because the hybrid current-mode filter 124 can pass a variety of different signals, the wireless transceiver 120 can include a single receiver chain instead of implementing multiple receiver chains. This saves cost and conserves space (e.g., silicon area) within the wireless transceiver 120.

The hybrid current-mode filter 124 includes a low-pass filter 126, a high-pass filter 128, and switch circuitry 130. The low-pass filter 126 can be implemented using active components, such as transistors, or passive components, such as inductors and capacitors. The high-pass filter 128 is implemented using passive components, including at least one shunt inductor and at least two series capacitors. The switch circuitry 130 includes at least three switches. Example implementations of the low-pass filter 126 and the high-pass filter 128 are further described with respect to FIGS. 5 and 7. Together, these components enable the hybrid current-mode filter 124 to at least partially implement current-mode filtering with switching, as further described in FIGS. 4 and 6.

Figure 2:
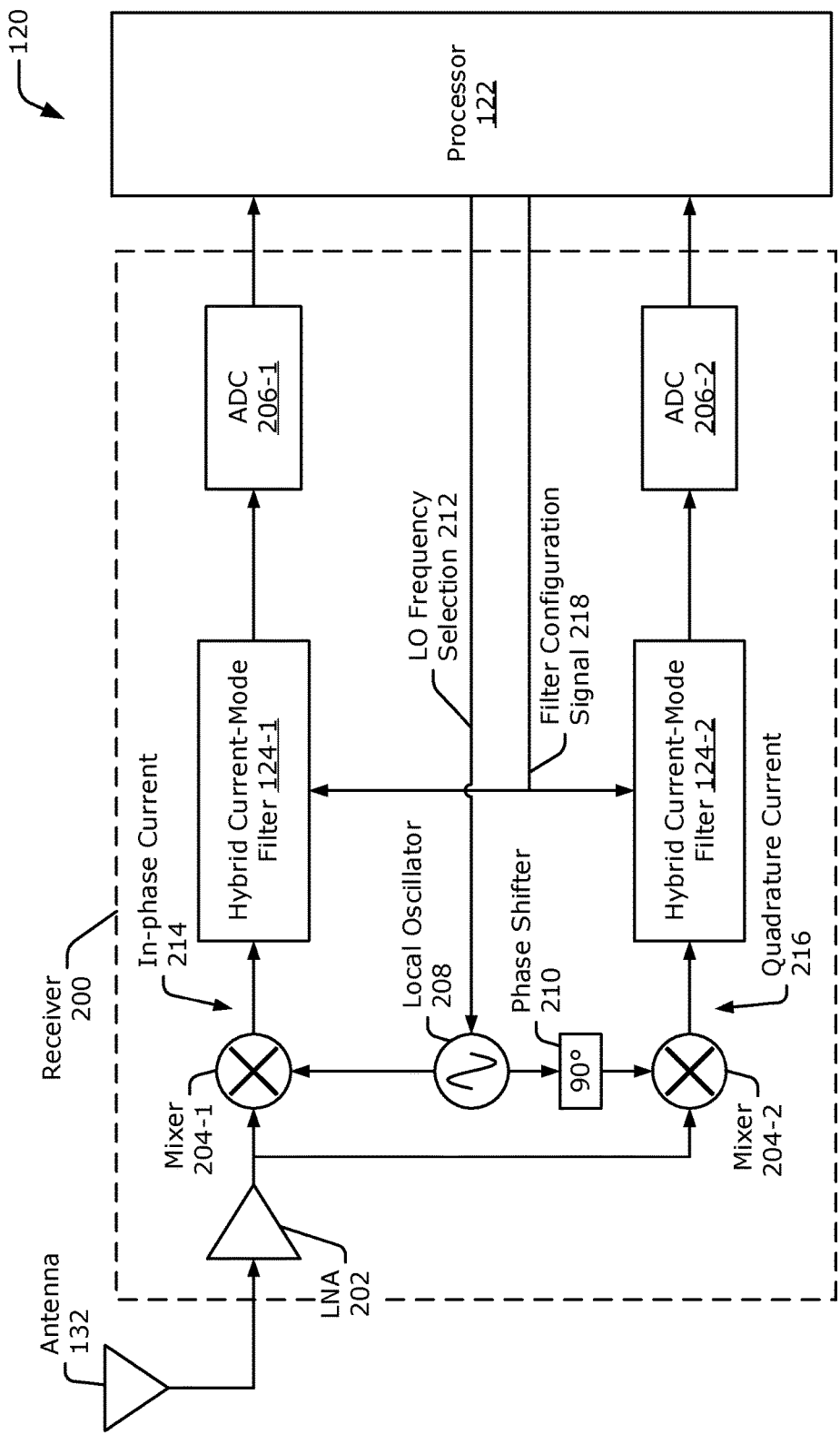
FIG. 2 illustrates a portion of an example wireless transceiver for current-mode filtering with switching.

FIG. 2 illustrates a portion of an example wireless transceiver 120 for current-mode filtering with switching. The wireless transceiver 120 includes a receiver 200, which can be implemented as a direct-conversion receiver (e.g., a homodyne receiver) or a zero intermediate-frequency (ZIF) receiver having one or more downconversion stages to transition from a radio-frequency domain to a baseband domain. The receiver 200 is coupled between the antenna 132 and the processor 122 and receives communication signals provided via the wireless link 106.

In the depicted configuration, the receiver 200 includes a low-noise amplifier (LNA) 202, two mixers 204-1 and 204-2, two hybrid current-mode filters 124-1 and 124-2, two analog-to-digital converters (ADCs) 206-1 and 206-2, a local oscillator 208, and a phase shifter 210. The hybrid current-mode filter 124-1 is coupled between the mixer 204-1 and the analog-to-digital converter 206-1. Likewise, the hybrid current-mode filter 124-2 is coupled between the mixer 204-2 and the other analog-to-digital converter 206-2. Example implementations of the hybrid current-mode filters 124-1 or 124-2 are further described with respect to FIGS. 4 and 6.

The antenna 132 provides a current to the low-noise amplifier 202. The current may be associated with a wideband signal, a narrowband signal, or multiple non-contiguous signals. The low-noise amplifier 202 amplifies the current and the mixers 204-1 and 204-2 downconvert the current from radio frequencies to baseband frequencies using a local oscillator signal, which is generated via the local oscillator 208. A frequency of the local oscillator signal is based on a local oscillator frequency selection 212, which is provided via the processor 122. The mixers 204-1 and 204-2, the phase shifter 210, and the local oscillator 208 together implement an in-phase and quadrature (I/Q) mixer (e.g., an I/Q demodulator), which generates an in-phase current 214 and a quadrature current 216 that are respectively provided to the hybrid current-mode filter 124-1 and the hybrid current-mode filter 124-2. Although not explicitly shown, the in-phase current 214 and the quadrature current 216 may each comprise differential currents. In general, the receiver 200 can include any number of hybrid current-mode filters 124 to support any number channels, such as the two hybrid current-mode filters 124 for the two in-phase and quadrature channels shown in FIG. 2.

As a current-mode filter, the hybrid current-mode filter 124 provides a filtered output based on an input current. The hybrid current-mode filters 124-1 and 124-2 pass different types of signals (e.g., a narrowband signal, multiple contiguous or non-contiguous narrowband signals, or a wideband signal) based on a filter configuration signal 218, which is provided via the processor 122. The filter configuration signal 218 enables the processor 122 to control the filter response of the hybrid current-mode filters 124-1 and 124-2.

The analog-to-digital converters 206-1 and 206-2 digitize the signals and the processor 122 processes the digitized signals to perform a communication operation (e.g., process a 5G downlink signal or perform carrier aggregation). The analog-to-digital converters 206-1 or 206-2 may be configured to accept current-mode inputs or voltage-mode inputs depending on an output configuration of the hybrid current-mode filters 124-1 or 124-2, respectively.

As shown in FIG. 2, the hybrid current-mode filters 124-1 and 124-2 enable the wireless transceiver 120 to include a single receiver 200 and reuse components, such as the low-noise amplifier 202 and the mixers 204-1 and 204-2. For example, the antenna 132 receives a wideband signal and multiple non-contiguous signals at different times. The low-noise amplifier 202 and the mixers 204-1 and 204-2 have sufficient bandwidth to respectively provide amplification and downconversion for processing both the wideband signal and multiple non-contiguous signals. Depending on an available frequency spectrum allocation, the processor 122 can customize the local oscillator frequency selection 212 and the filter configuration signal 218 to increase data rates, as shown in FIGS. 3-1, 3-2, and 3-3.

Figures 1, 3:
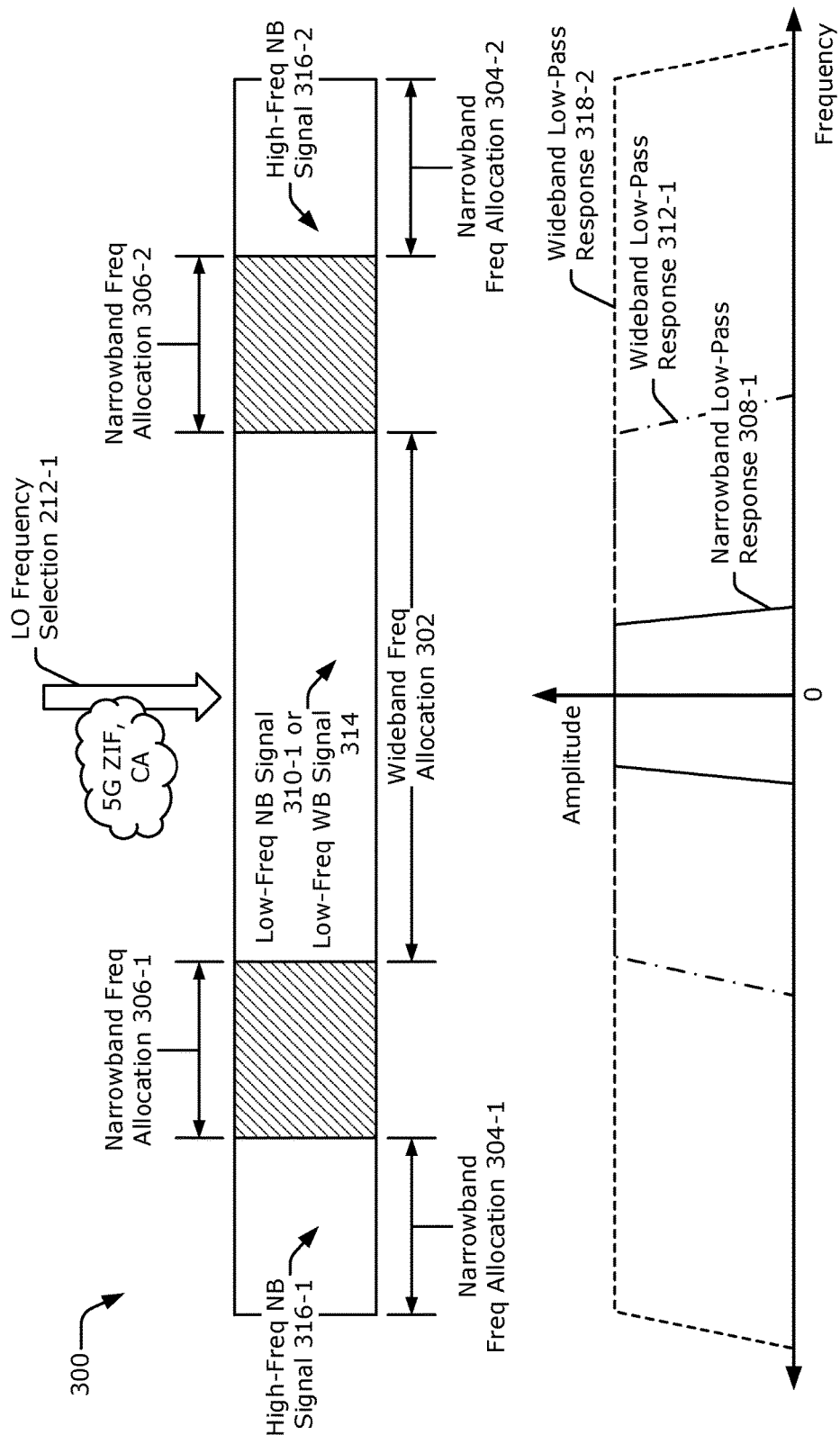
Figures 2, 3:
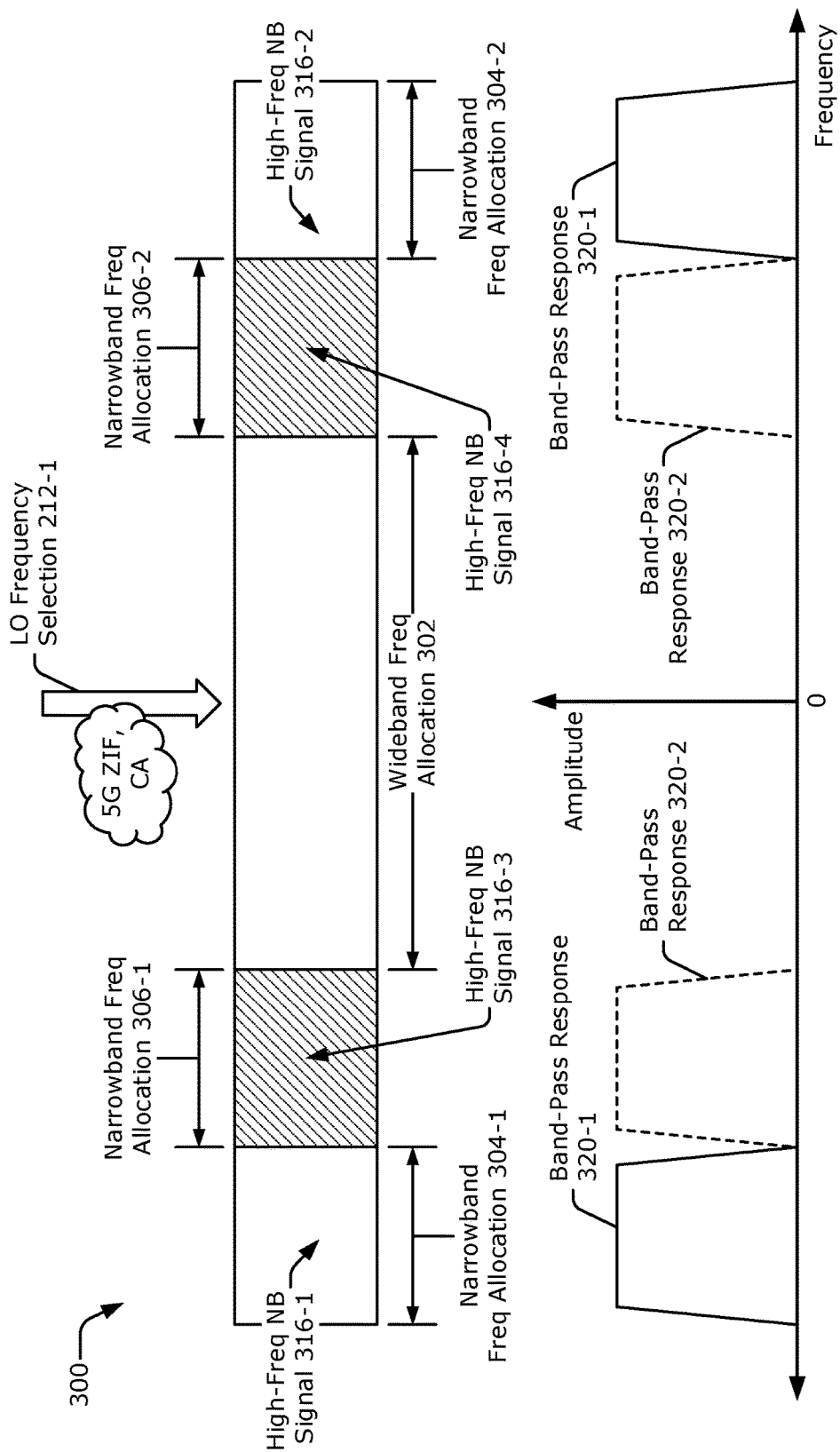
Figure 3:
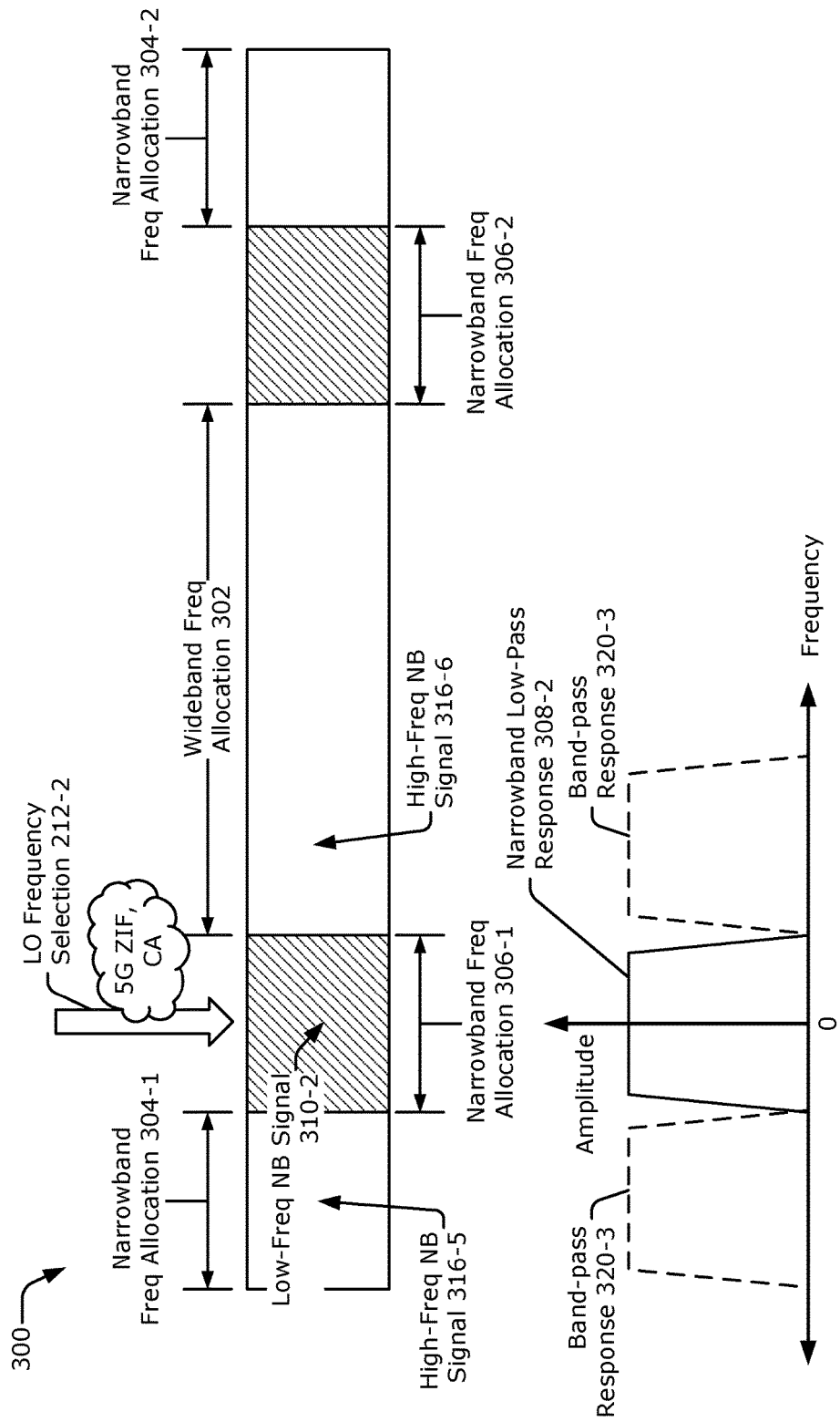

FIG. 3-1 illustrates example low-pass responses of the hybrid current-mode filter 124 for current-mode filtering with switching. A portion of an example frequency spectrum allocation 300 is shown to include a wideband frequency allocation 302 and two narrowband frequency allocations 304-1 and 304-2, which are associated with a network provider. Disposed between the wideband frequency allocation 302 and the two narrowband frequency allocations 304-1 and 304-2 are other narrowband frequency allocations 306-1 and 306-2, which are allocated to a different network provider (as indicated via the diagonal pattern). The frequencies associated with the frequency spectrum allocation 300 may be considered as radio frequencies or intermediate frequencies based on the type of frequency stage that occurs within the receiver 200 prior to downconverting to baseband.

Using the local oscillator frequency selection 212 in FIG. 2, the processor 122 adjusts the local oscillator frequency to set a zero intermediate frequency (e.g., a DC frequency or a baseband frequency). To utilize the wideband frequency allocation 302 for 5G modes, for example, a local oscillator frequency selection 212-1 is chosen to cause the local oscillator frequency to be near a center of the wideband frequency allocation 302. This sets the zero intermediate frequency to be relative to the center of the wideband frequency allocation 302.

Within the baseband domain, different signals may be characterized with respect to the zero intermediate frequency. A low-frequency signal, for example, has a center frequency near the zero intermediate frequency while a high-frequency signal has a center frequency that is offset relative to the zero intermediate frequency (e.g., offset by approximately several MHz or more). Different types of low-frequency and high-frequency signals are shown in FIGS. 3-1, 3-2, and 3-3. For visual clarity, a center frequency and a bandwidth for each of these signals are not explicitly shown. Instead an arrow points to a particular frequency allocation that the center frequency and bandwidth of the signal is associated with. In other words, the signal includes frequencies that are within at least a portion of the frequency allocation identified by the arrow.

Along with the local oscillator frequency selection 212-1, the processor 122 can cause the hybrid current-mode filter 124 to have a low-pass response via the filter configuration signal 218. With the low-pass response, the hybrid current-mode filter 124 can pass at least one low-frequency or high-frequency signal. Different low-pass responses may be realized by tuning or adjusting a cut-off frequency of the low-pass filter 126. In general, a bandwidth of the low-pass response is designed to encompass one or more signals and may be on the order of a few megahertz (MHz) or a few gigahertz (GHz) (e.g., between approximately 10 MHz and 4 GHz).

For example, the hybrid current-mode filter 124 may be configured to have a narrowband low-pass response 308-1 to pass a low-frequency narrowband (NB) signal 310-1 having a center frequency near the local oscillator frequency selection 212-1. As another example, the hybrid current-mode filter 124 may be configured to have a wideband low-pass response 312-1 to encompass a larger portion of the wideband frequency allocation 302 and pass a low-frequency wideband (WB) signal 314 having a center frequency near the local oscillator frequency selection 212-1. The wideband low-pass response 312-1 also enables the hybrid current-mode filter to pass multiple narrowband signals that may be within the wideband frequency allocation 302.

To pass multiple non-contiguous signals that are within the narrowband frequency allocation 304-1 (e.g., a high-frequency narrowband signal 316-1), within the wideband frequency allocation 302 (e.g., the low-frequency narrowband signal 310-1 or the low-frequency wideband signal 314), or within the narrowband frequency allocation 304-2 (e.g., a high-frequency narrowband signal 316-2), the hybrid current-mode filter 124 is configured to have a wideband low-pass response 318-2, with a bandwidth that encompasses these different frequency allocations. In this case, the hybrid current-mode filter 124 may also pass signals that are within the narrowband frequency allocations 306-1 and 306-2. If these narrowband frequency allocations 306-1 and 306-2 include high-power jammers, the hybrid current-mode filter 124 may be configured to have a band-pass response instead, as described in further detail with respect to FIG. 3-2.

FIG. 3-2 illustrates example band-pass responses of the hybrid current-mode filter 124 for current-mode filtering with switching. Similar to FIG. 3-1, the local oscillator frequency selection 212-1 sets the zero intermediate frequency to be relative to a center of the wideband frequency allocation 302. Along with providing the local oscillator frequency selection 212-1, the processor 122 can cause the hybrid current-mode filter 124 to have a band-pass response via the filter configuration signal 218. With the band-pass response, the hybrid current-mode filter 124 can pass at least one high-frequency signal and attenuate jammers. In general, different band-pass responses 320-1 or 320-2 may be realized by tuning or adjusting respective cut-off frequencies of the low-pass filter 126 or the high-pass filter 128. A bandwidth of the band-pass response 3201 or 320-2 may be on the order of hundreds of megahertz (MHz) (e.g., between approximately 100 MHz and 1 GHz).

The hybrid current-mode filter 124 may be configured to have a band-pass response 320-1 to pass one or more of the high-frequency narrowband signals 316-1 or 316-2 and attenuate one or more jammer signals that are within the narrowband frequency allocations 306-1 and 306-2. Alternatively, the hybrid current-mode filter 124 may be configured to have a band-pass response 320-2 to pass one or more of the high-frequency narrowband signals 316-3 or 316-4 that are within the narrowband frequency allocations 306-1 and 306-2 and attenuate one or more jammer signals that are within the wideband frequency allocation 302. As such, the hybrid current-mode filter 124 can readily support different frequency allocations of different network providers. By passing the high-frequency narrowband signals 316-1 and 316-2 or the high-frequency narrowband signals 316-3 and 316-4, data rates may be increased using non-contiguous carrier aggregation (NCCA). In some implementations, the local oscillator frequency selection 212 of FIG. 2 can be dynamically adjusted by the processor 122 to set the zero intermediate frequency relative to another frequency, as shown in FIG. 3-3.

FIG. 3-3 illustrates other example responses of the hybrid current-mode filter 124 for current-mode filtering with switching. In this case, the processor 122 provides a local oscillator frequency selection 212-2, which sets the zero intermediate frequency relative to a center of the narrowband frequency allocation 306-1. Along with the local oscillator frequency selection 212-2, the processor 122 can cause the hybrid current-mode filter 124 to have a narrowband low-pass response 308-2 to pass a low-frequency narrowband signal 310-2. To pass one or more high-frequency narrowband signals 316-5 or 316-6, the hybrid current-mode filter 124 may be configured to have the band-pass response 320-3. This enables the hybrid current-mode filter 124 to pass non-contiguous signals that are respectively within the narrowband frequency allocation 304-1 and the wideband frequency allocation 302, and to attenuate other signals or jammers that may be within the narrowband frequency allocation 306-1. In general, different local oscillator frequency selections 212 and filter configuration signals 218 enable efficient use of available portions of the frequency spectrum allocation 300. As shown in FIGS. 3-1, 3-2, and 3-3, the different responses of the hybrid current-mode filter 124 can be real and symmetrical about the zero intermediate frequency. An example implementation of the hybrid current-mode filter 124 is further described with respect to FIG. 4.

Figure 4:
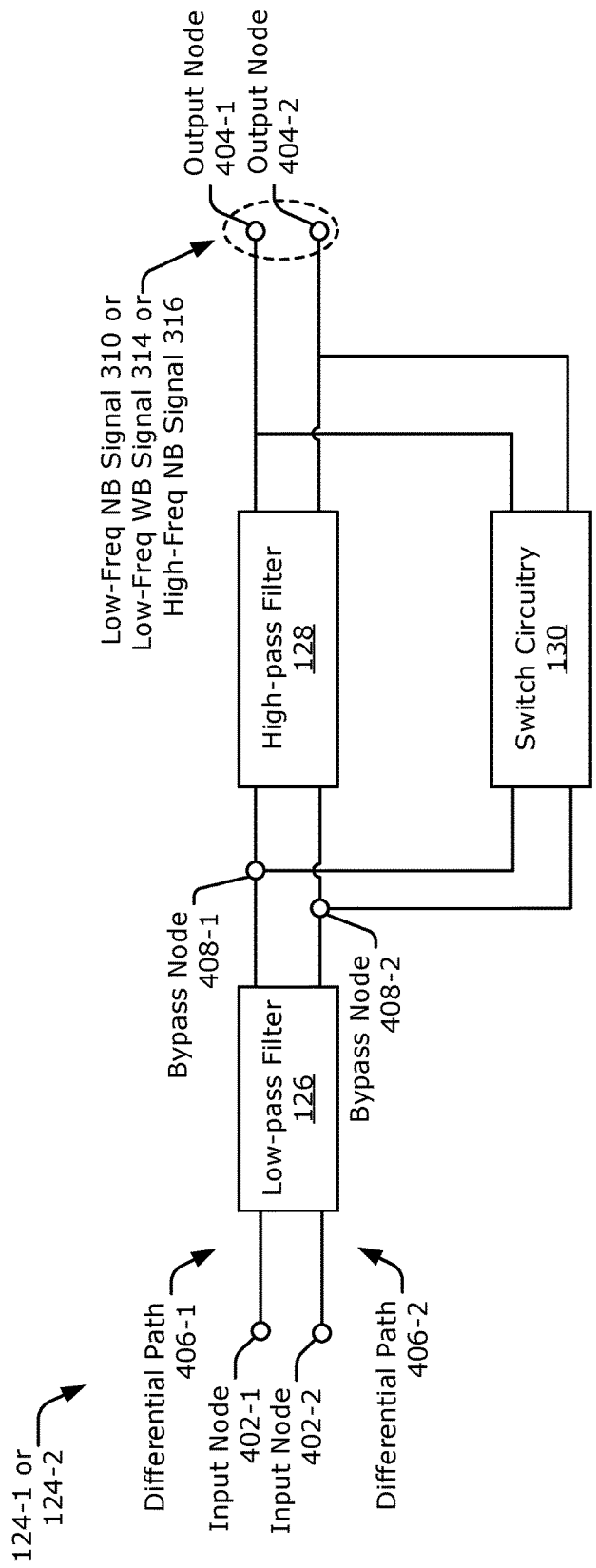
FIG. 4 illustrates an example hybrid current-mode filter for current-mode filtering with switching.

FIG. 4 illustrates an example hybrid current-mode filter 124 for current-mode filtering with switching. The hybrid current-mode filter 124 includes input nodes 402-1 and 402-2, output nodes 404-1, and 404-2, differential paths 406-1 and 406-2, bypass nodes 408-1 and 408-2, the low-pass filter 126, the high-pass filter 128, and the switch circuitry 130. The differential paths 406-1 and 406-2 are respectively coupled between the input nodes 402-1 and 402-2 and the output nodes 404-1 and 404-2. Together the differential paths 406-1 and 406-2 implement a single differential pair of paths. The input nodes 402-1 and 402-2 can be coupled to a mixer, such as the mixers 204-1 or 204-2 of FIG. 2. The output nodes 404-1 and 404-2 can be coupled to an analog-to-digital converter, such as the analog-to-digital converters 206-1 or 206-2 of FIG. 2.

Figure 6:
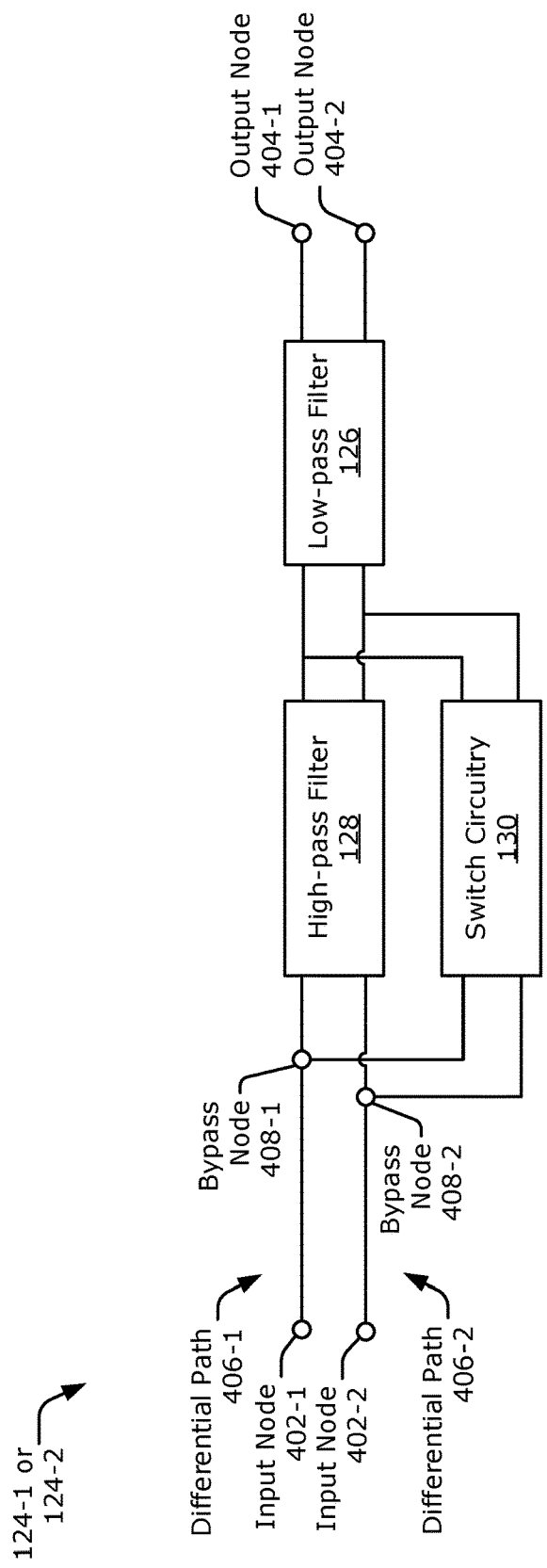
FIG. 6 illustrates another example hybrid current-mode filter for current-mode filtering with switching.

In the depicted configuration, the low-pass filter 126 is coupled between the input nodes 402-1 and 402-2 and the bypass nodes 408-1 and 408-2. Alternatively, the low-pass filter 126 can be coupled between the high-pass filter 128 and the output nodes 404-1 and 404-2, as shown in FIG. 6. The high-pass filter 128 is coupled between the bypass nodes 408-1 and 408-2 and the output nodes 404-1 and 404-2. The switch circuitry 130 is also coupled between the bypass nodes 408-1 and 408-2 and the output nodes 404-1 and 404-2.

The switch circuitry 130 connects or disconnects portions of the differential paths 406-1 and 406-2 to cause the hybrid current-mode filter 124 to have a low-pass response 308, 312, or 318 or a band-pass response 320. To achieve the low-pass response 308, 312, or 318, for example, the switch circuitry 130 bypasses the high-pass filter 128. Therefore, an input current that is accepted at the input nodes 402-1 and 402-2 is filtered by the low-pass filter 126, which enables one or more signals, such as the low-frequency narrowband signal 310-1 or 310-2, the low-frequency wideband signal 314, or one of the high-frequency narrowband signals 316-1 . . . 316-6 of FIG. 3-1, 3-2, or 3-3, to be passed along the differential paths 406-1 and 406-2 to the output nodes 404-1 and 404-2.

To achieve the band-pass response 320, the switch circuitry 130 engages the high-pass filter 128 such that the band-pass response 320 comprises a superposition of a low-pass response provided via the low-pass filter 126 and a high-pass response provided via the high-pass filter 128. The band-pass response 320 enables the hybrid current-mode filter 124 to attenuate low-frequency jammers (e.g., currents having frequencies near the zero-intermediate frequency) to provide rejection or reduce interference. An amount of attenuation or rejection may be on the order of tens of decibels (dB) (e.g., greater than approximately 30 dB or greater than approximately 40 dB). The band-pass response can pass non-contiguous signals (e.g., currents having frequencies offset relative to the zero intermediate frequency), such as the high-frequency narrowband signals 316-1 and 316-2 in FIG. 3-2. The non-contiguous signals are passed along the differential paths 406-1 and 406-2 to the output nodes 404-1 and 404-2. Example implementations of the low-pass filter 126, the high-pass filter 128, and the switch circuitry 130 are further described with respect to FIGS. 5 and 7.

Figure 5:
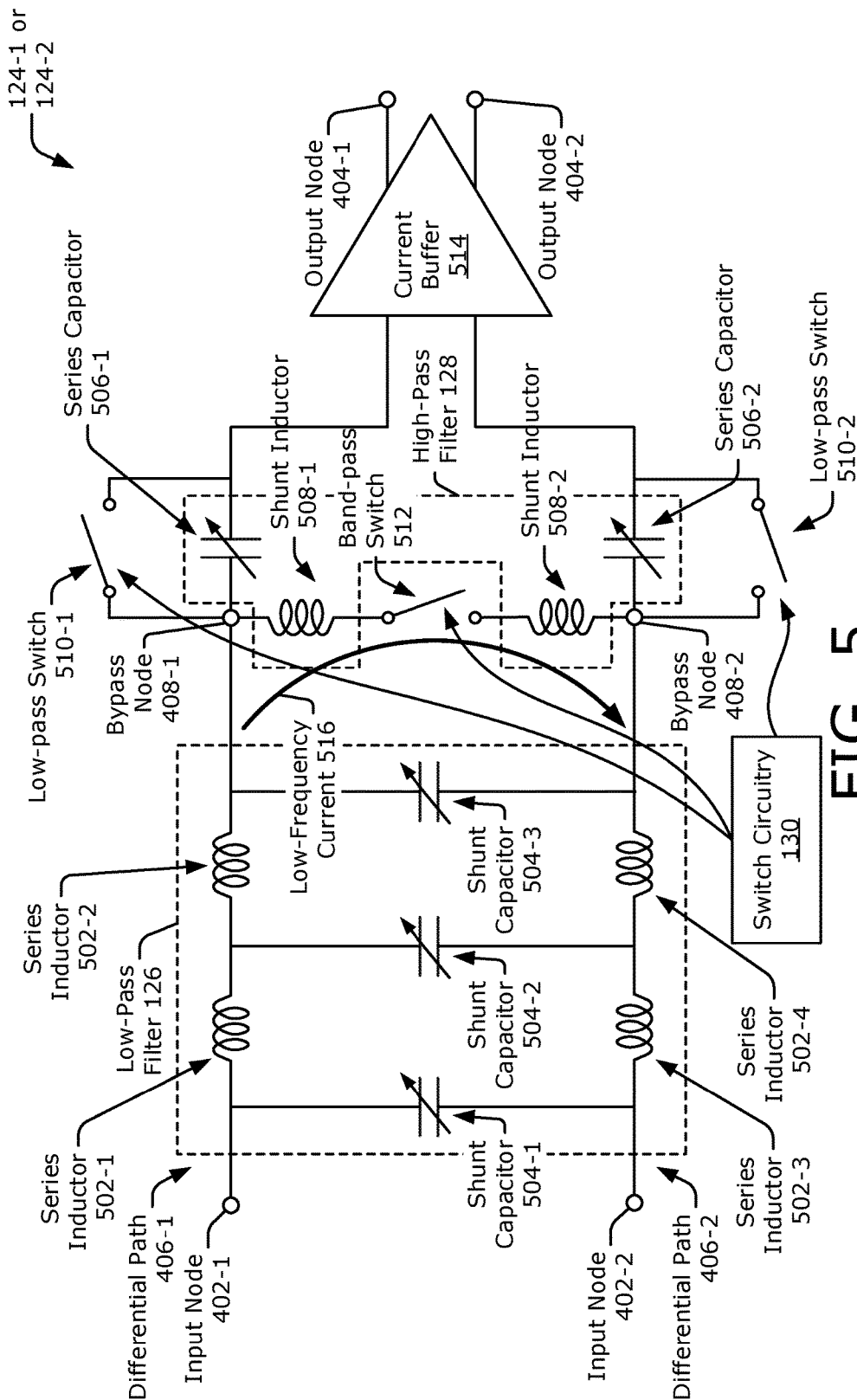
FIG. 5 illustrates an example low-pass filter and high-pass filter for current-mode filtering with switching.

FIG. 5 illustrates an example low-pass filter 126 and high-pass filter 128 for current-mode filtering with switching. In the depicted configuration, the low-pass filter 126 and the high-pass filter 128 are each implemented using one or more inductors and capacitors. The low-pass filter 126, for example, includes four series inductors 502-1, 502-2, 502-3, and 502-4 and three shunt capacitors 504-1, 504-2, and 504-3. The series inductors 502-1 and 502-2 are coupled in series along the differential path 406-1 between the input node 402-1 and the bypass node 408-1. Likewise, the series inductors 502-3 and 502-4 are coupled in series along the differential path 406-2 between the input node 402-2 and the bypass node 408-2. The three shunt capacitors 504-1, 504-2, and 504-3 are respectively coupled between the differential paths 406-1 and 406-2.

The high-pass filter 128 includes two series capacitors 506-1 and 506-2 and at least one shunt inductor 508, which is shown as two shunt inductors 508-1 and 508-2 in FIG. 5. The series capacitor 506-1 is coupled in series along the differential path 406-1 between the bypass node 408-1 and the output node 404-1. Likewise, the series capacitor 506-2 is coupled in series along the differential path 406-2 between the bypass node 408-2 and the output node 404-2. The shunt inductors 508-1 and 508-2 are respectively coupled to the bypass nodes 408-1 and 408-2.

The switch circuitry 130 includes two low-pass switches 510-1 and 510-2 and at least one band-pass switch 512. The two low-pass switches 510-1 and 510-2 are respectively coupled in parallel with the series capacitors 506-1 and 506-2 (e.g., respectively coupled between the bypass nodes 408-1 and 408-2 and the output nodes 404-1 and 404-2). The band-pass switch 512 is coupled in series with the shunt inductors 508-1 and 508-2 between the bypass nodes 408-1 and 408-2. In this configuration, the band-pass switch 512 is coupled between the shunt inductors 508-1 and 508-2. In some implementations, the band-pass switch 512 may comprise two band-pass switches 512 that are respectively coupled to the bypass nodes 408-1 and 408-2. In this case, the one or more shunt inductors 508 may be coupled in series between the two band-pass switches 512. Respective states of the low-pass switches 510-1 and 510-2 and the band-pass switch 512 can be controlled by the processor 122 via the filter configuration signal 218.

If the low-pass switches 510-1 and 510-2 are closed and the band-pass switch 512 is opened, the high-pass filter 128 is effectively bypassed. This enables the hybrid current-mode filter 124 to have a low-pass response 308, 312, or 318. Alternatively, if the low-pass switches 510-1 and 510-2 are opened and the band-pass switch 512 is closed, low-frequency currents, such as a low-frequency current 516, are attenuated relative to the output nodes 404-1 and 404-2. This is because the shunt inductors 508-1 and 508-2 and the closed band-pass switch 512 create a low-impedance path for the low-frequency current 516 to circulate through (e.g., pass between the differential paths 406-1 and 406-2). By opening the low-pass switches 510-1 and 510-2, the series capacitors 506-1 and 506-2 create a high-impedance path for the low-frequency current 516, which further assists in causing the low-frequency current 516 to be steered away from the output nodes 404-1 and 404-2.

In some cases, the low-frequency current 516 may correspond to a jammer that exists within an unavailable frequency spectrum associated with a different network provider, such as the narrowband frequency allocations 306-1 or 306-2 of FIG. 3-2. By steering the jammer away from the output nodes 404-1 and 404-2, the hybrid current-mode filter 124 prevents the jammer from desensitizing the receiver 200 or interfering with detection of the high-frequency narrowband signals 316-1 or 316-2. Because the high-pass filter 128 and the low-pass filter 126 are implemented using passive components, the hybrid current-mode filter 124 achieves a target linearity that prevents the jammer from generating other spurious signals that may interfere with the high-frequency narrowband signals 316-1 or 316-2. Accordingly, the hybrid current-mode filter 124 can achieve a target signal-to-noise ratio to enable carrier aggregation.

In some implementations, the shunt capacitors 504-1, 504-2, and 504-3 and the series capacitors 506-1 and 506-2 are implemented as variable capacitors whose capacitances may be tuned by the processor 122 via the filter configuration signal 218. Adjusting these capacitances adjusts characteristics of the filter response of the hybrid current-mode filter 124, which enables the hybrid current-mode filter 124 to support frequency allocations for different network providers, different continents, and for different frequency bands. Example adjustable characteristics of the filter response include a cut-off frequency, rolloff, bandwidth, or quality factor. This customization, for example, enables the response of the hybrid current-mode 124 to be appropriately tuned for bandwidths of the low-frequency narrowband signal 310, the low-frequency wideband signal 314, or the high-frequency narrowband signal 316-1 . . . 316-6, or a separation of non-contiguous signals, such as the high-frequency narrowband signals 316-1 and 316-2. Along the same lines, other implementations may enable the inductances of the series inductors 502-1, 502-2, 502-3, and 502-4 and the shunt inductors 508-1 and 508-2 to be tuned.

The hybrid current-mode filter 124 may also include at least one current buffer 514. The current buffer 514 receives the differential currents that are passed from the bypass nodes 408-1 and 408-2 and produces output currents at the output nodes 404-1 and 404-2. The output currents are received by the analog to digital converter 206-1 or 206-2. The current buffer 514 in FIG. 5 may be used to achieve a target impedance for the hybrid current-mode filter 124. This enables the impedance of the hybrid current-mode filter 124 to be decoupled from other components within the receiver 200, such as the analog-to-digital converters 206-1 or 206-2. A variable resistor (not shown) could be placed at the output of the current buffer to provide a voltage output signal to the analog-to-digital converters 206-1 or 206-2. The current buffer 514 may be implemented using a transistor configured as a common-gate amplifier. Other implementations of the current buffer 514 may use a variable resistor that is coupled between the differential paths 406-1 and 406-2. Instead of including the current buffer 514, the analog-to-digital converters 206-1 or 206-2 can be designed to accept a current input and provide a target impedance to the hybrid current-mode filters 124-1 or 124-2. Another implementation of the hybrid current-mode filter 124 in which the low-pass filter 126 is coupled after the high-pass filter 128 is further described with respect to FIG. 6.

FIG. 6 illustrates another example low-pass filter 126 and high-pass filter 128 for current-mode filtering with switching. In the depicted configuration, the low-pass filter 126 is coupled between the high-pass filter 128 and the output nodes 404-1 and 404-2. The low-pass filter 126 in this instance may also be implemented using one or more passive components (e.g., as shown in FIG. 5) or using one or more active components. Because the low-pass filter 126 is between the high-pass filter 128 and the output nodes 404-1 and 404-2, the utilization of active components does not significantly degrade linearity performance because the jammer or low-frequency current 516 is previously attenuated at the bypass nodes 408-1 and 408-2 via the switch circuitry 130 and the high-pass filter 128. In some cases, the low-pass filter 126 may be implemented using a combination of passive and active components, as shown in FIG. 7.

Figure 7:
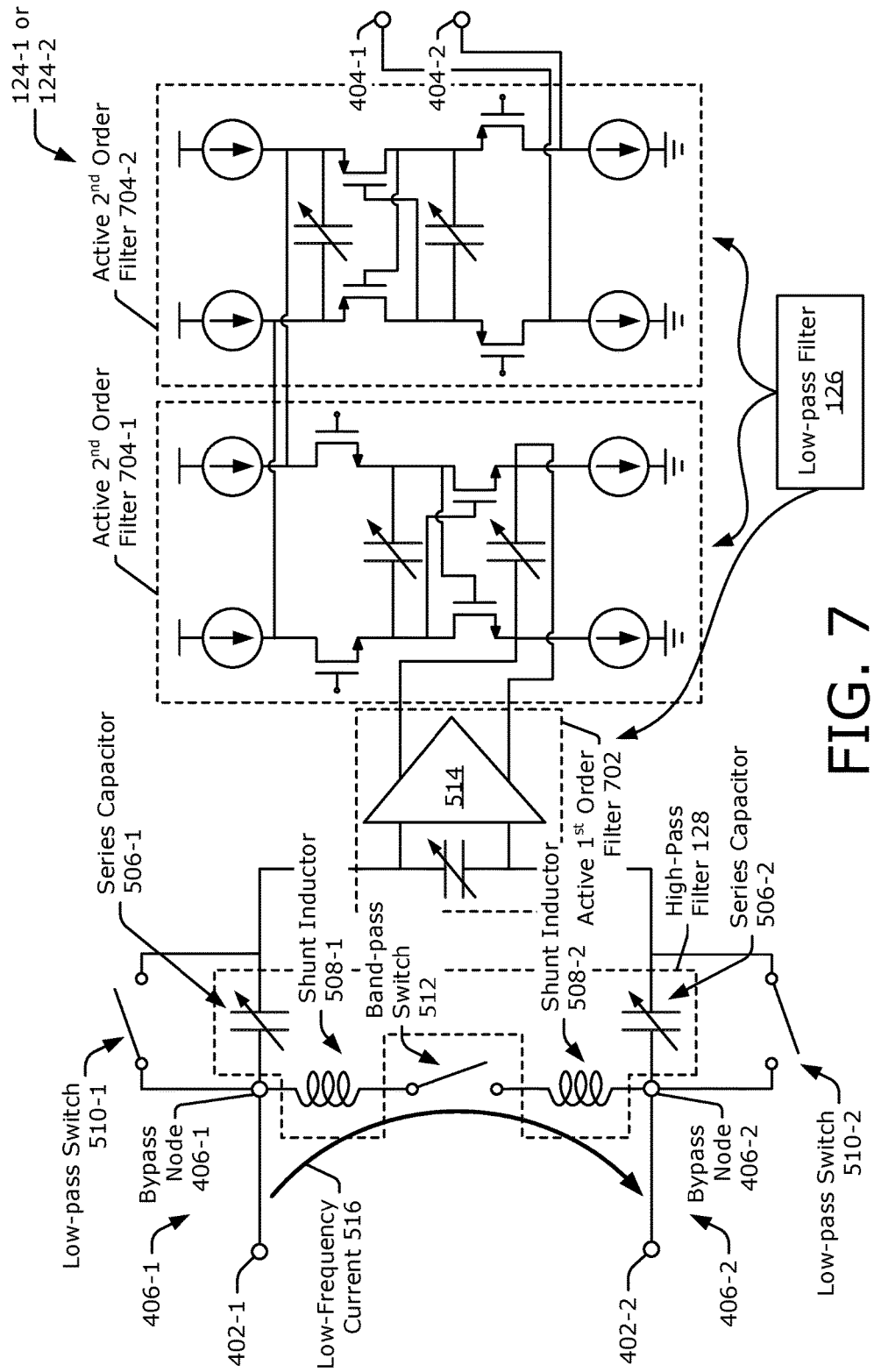
FIG. 7 illustrates another example low-pass filter for current-mode filtering with switching.

FIG. 7 illustrates an example implementation of the low-pass filter 126 for current-mode filtering with switching. In the depicted configuration, the low-pass filter 126 includes an active first-order filter 702 and two active second-order filters 704-1 and 704-2. The active first-order filter 702 comprises a variable capacitor, which is coupled in shunt between the differential paths 406-1 and 406-2, and the current buffer 514, which has a resistive input impedance and is coupled in parallel to the variable capacitor between the differential paths 406-1 and 406-2. In this example, the active second-order filters 704-1 and 704-2 are implemented as cascaded current-mode biquadratic filters, which are respectively implemented using n-channel metal-oxide semiconductor (NMOS) and p-channel metal-oxide semiconductor (PMOS) field-effect transistors.

In some implementations, in a similar fashion as FIG. 5, the capacitors in the active first-order filter 702 and the active second-order filters 704-1 and 704-2 are implemented as variable capacitors whose capacitances may be tuned by the processor 122 via the filter configuration signal 218. Adjusting these capacitances adjusts characteristics of the filter response of the hybrid current-mode filter 124, which enables the hybrid current-mode filter 124 to support frequency allocations for different network providers, different continents, and for different frequency bands. Example adjustable characteristics of the filter response include a cut-off frequency, rolloff, bandwidth, or quality factor. This customization, for example, enables the response of the hybrid current-mode 124 to be appropriately tuned to pass one or more signals or to pass non-contiguous signals that are separated in frequency by a certain amount.

The active second-order filters 704-1 and 704-2 are complex filters, which, together with the active first-order filter 702, implement a fifth-order low-pass filter. Although depicted as a fifth-order low-pass filter in FIG. 7, other implementations of the low-pass filter 126 may have a filter order less than or greater than five. In comparison to the low-pass filter 126 in FIG. 5, the low-pass filter 126 in FIG. 7 may utilize less space and provide more tunability for adjusting the low-pass response 308, 312, or 318. The transistors within the low-pass filter 126 and other components, such as the current buffer 514 and capacitors, may also be stacked underneath the inductors of the high-pass filter 128 to further conserve space within the wireless transceiver 120.

Figure 8:
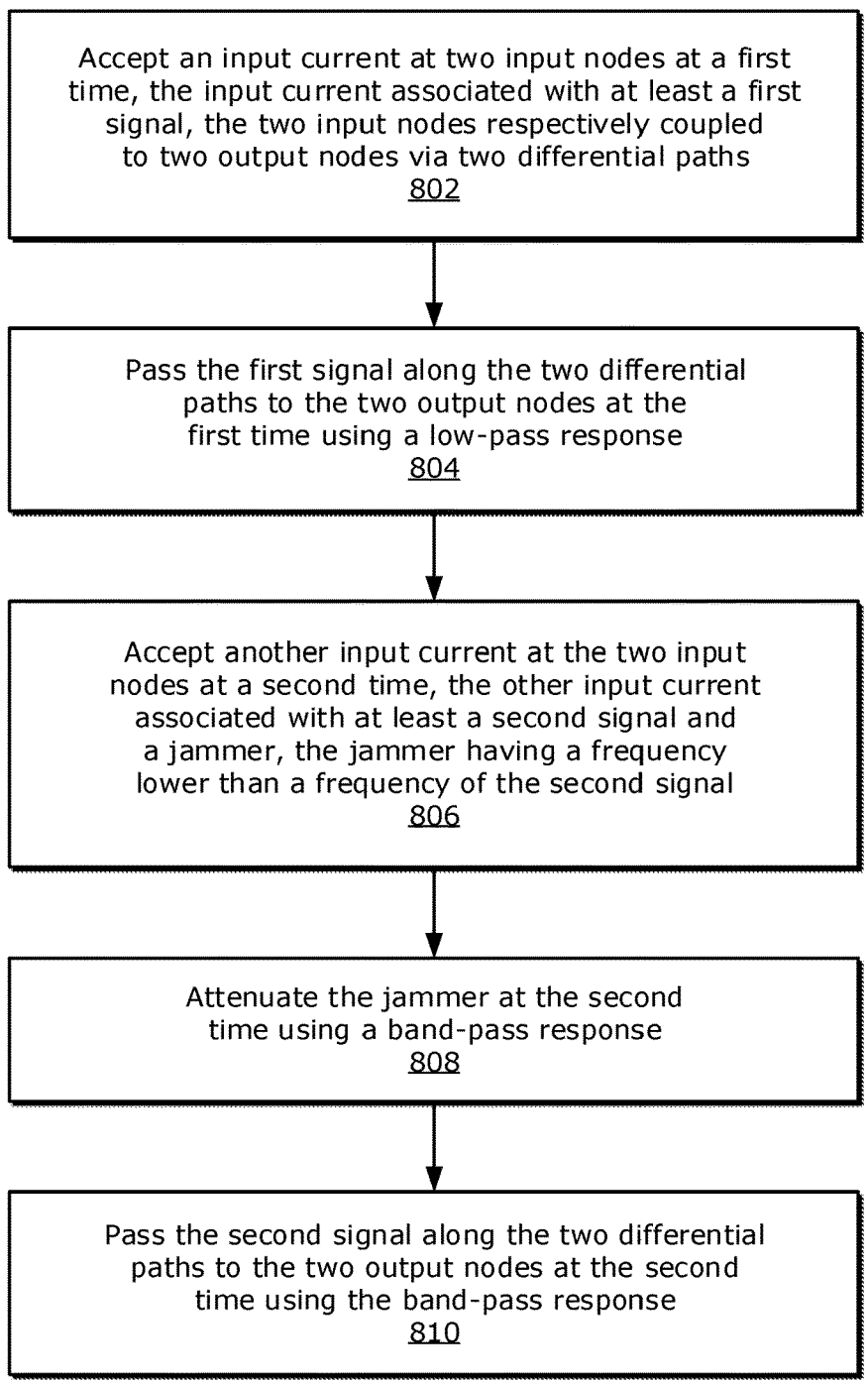
FIG. 8 is a flow diagram illustrating an example process for current-mode filtering using current steering with switching.

FIG. 8 is a flow diagram illustrating an example process 800 for current-mode filtering with switching. The process 800 is described in the form of a set of blocks 802-810 that specify operations that can be performed. However, operations are not necessarily limited to the order shown in FIG. 8 or described herein, for the operations may be implemented in alternative orders or in fully or partially overlapping manners. Operations represented by the illustrated blocks of the process 800 may be performed by a computing device 102 (e.g., of FIG. 1) or a wireless transceiver 120 (e.g., of FIG. 1 or 2). More specifically, the operations of the process 800 may be performed by a hybrid current-mode filter 124 as shown in FIG. 1, 2, or 4-7.

At block 802, an input current is accepted at two input nodes at a first time. The input current is associated with at least a first signal and the two input nodes are respectively coupled to two output nodes via two differential paths. For example, the input nodes 402-1 and 402-2 of the hybrid current-mode filter 124 may accept an input current (e.g., differential currents), such as the in-phase current 214 or the quadrature current 216 of FIG. 2, at the first time. The input current may be associated with the low-frequency narrowband signal 310-1 or 310-2, the low-frequency wideband signal 314, at least one of the high-frequency narrowband signals 316-1 . . . 316-6, or any combination thereof, as shown in FIGS. 3-1, 3-2, and 3-3. The input nodes 402-1 and 402-2 are coupled to the two output nodes 404-1 and 404-2 via the differential paths 406-1 and 406-2.

At block 804, the first signal is passed along the two differential paths to the two output nodes at the first time using a low-pass response. For example, the low-pass filter 126 and the switch circuitry 130 pass the first signal along the two differential paths 406-1 and 406-2 to the output nodes 404-1 and 404-2 at the first time. Although the hybrid current-mode filter 124 includes the high-pass filter 128, the switch circuitry 130 enables the high-pass filter 128 to be bypassed such that the filter response of the hybrid current-mode filter 124 is based on a low-pass response of the low-pass filter 126. Depending on the type of signal and the local oscillator frequency selection 212, the hybrid current-mode filter 124 may pass the first signal using the narrowband low-pass response 308-1, the wideband low-pass response 312-1, the wideband low-pass response 312-2, or the narrowband low-pass response 308-2, as shown in FIGS. 3-1 and 3-3.

At block 806, another input current is accepted at the two input nodes at a second time. The other input current is associated with at least a second signal and a jammer. The jammer has a frequency that is lower than a frequency of the second signal. For example, the input nodes 402-1 and 402-2 of the hybrid current-mode filter 124 may accept another input current that is associated with one or more of the high-frequency narrowband signals 316-1 . . . 316-6 of FIGS. 3-2 and 3-3 at the second time. While the high-frequency narrowband signal 316-1 . . . 316-6 may have frequencies that are within one of the narrowband frequency allocations 304-1, 304-2, 306-1, or 306-2, or the wideband frequency allocation 302, the jammer has a lower frequency than the high-frequency narrowband signal 316-1 . . . 316-6 (e.g., a center frequency that is closer to the zero intermediate frequency). The jammer may be within, for example, the wideband frequency allocation 302 or the narrowband frequency allocation 306-1 or 306-2, depending on which portion of the frequency spectrum allocation 300 is not desired or not allocated to a chosen network provider and the local oscillator frequency selection 212. In some cases, the second signal may comprise two non-contiguous signals and the jammer may have a frequency that is between the two non-contiguous signals. The jammer is represented by the low-frequency current 516 in FIG. 5.

At block 808, the jammer is attenuated at the second time using a band-pass response. For example, the high-pass filter 128 and the switch circuitry 130 can provide a low-impedance path between the bypass nodes 408-1 and 408-2, which attenuates the low-frequency current 516 with respect to the output nodes 404-1 and 404-2 at the second time. In this case, the switch circuitry 130 engages the high-pass filter 128 such that the filter response of the hybrid current-mode filter 124 comprises one of the band-pass responses 320-1, 320-2, or 320-3 of FIGS. 3-2 and 3-3. The band-pass response 320 represents a superposition of the low-pass response of the low-pass filter 126 and the high-pass response of the high-pass filter 128.

At block 810, the second signal is passed along the two differential paths to the two output nodes at the second time using the band-pass response. For example, the low-pass filter 126, the high-pass filter 128, and the switch circuitry 130 pass at least one of the high-frequency narrowband signals 316-1 . . . 316-6 to the output nodes 404-1 and 404-2 at the second time.

Passing different types of signals at different times enables the computing device 102 to realize increased data rates by utilizing 5G modes or carrier aggregation. Because the response of the hybrid current-mode filter 124 is configurable, a single receiver 200 may be implemented, which saves cost and efficiently utilizes space within the wireless transceiver 120.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Further, items represented in the accompanying figures and terms discussed herein may be indicative of one or more items or terms, and thus reference may be made interchangeably to single or plural forms of the items and terms in this written description. Finally, although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:
1. An apparatus comprising:
   a filter including:
      two input nodes, two output nodes, and two differential paths respectively coupled between the two input nodes and the two output nodes;

two bypass nodes respectively coupled between the two input nodes and the two output nodes along the two differential paths;
a high-pass filter coupled between the two bypass nodes and the two output nodes, the high-pass filter including two series capacitors and at least one shunt inductor, the two series capacitors respectively coupled between the two bypass nodes and the two output nodes;
two low-pass switches respectively coupled in parallel with the two series capacitors between the two bypass nodes and the two output nodes;
at least one band-pass switch coupled in series with the at least one shunt inductor between the two bypass nodes; and
a low-pass filter coupled in series with the high-pass filter along the two differential paths.

2. The apparatus of claim 1, wherein:
the filter is configured to have a low-pass response based on the band-pass switch being opened and the two low-pass switches being closed; and
the filter is configured to pass at least one signal based on the low-pass response.

3. The apparatus of claim 2, wherein the at least one signal comprises a wideband signal or multiple narrowband signals.

4. The apparatus of claim 1, wherein:
the filter is configured to have a band-pass response based on the band-pass switch being closed and the two low-pass switches being opened; and
the filter is configured to pass at least one signal based on the band-pass response.

5. The apparatus of claim 4, wherein the at least one signal comprises two non-contiguous signals.

6. The apparatus of claim 1, wherein the low-pass filter is coupled between the two input nodes and the two bypass nodes.

7. The apparatus of claim 6, wherein the low-pass filter comprises at least one shunt capacitor and at least two series inductors, the at least one shunt capacitor coupled between the two differential paths, the at least two series inductors respectively coupled in series between the two input nodes and the two bypass nodes.

8. The apparatus of claim 1, wherein the low-pass filter is coupled in series between the high-pass filter and the two output nodes along the two differential paths.

9. The apparatus of claim 8, wherein the low-pass filter comprises at least one shunt capacitor and at least two series inductors, the at least one shunt capacitor is coupled between the two differential paths, and the at least two series inductors are respectively coupled in series between the two series capacitors and the two output nodes.

10. The apparatus of claim 8, wherein the low-pass filter comprises a shunt capacitor, a current buffer, and at least one active filter; the shunt capacitor is coupled between the two differential paths; and the current buffer and the at least one active filter are coupled in series between the high-pass filter and the two output nodes along the two differential paths.

11. The apparatus of claim 10, wherein the at least one active filter comprises at least one current-mode biquadratic filter.

12. The apparatus of claim 1, wherein:
the at least one band-pass switch comprises two band-pass switches respectively coupled to the two bypass nodes; and
the at least one shunt inductor is coupled between the two band-pass switches.

13. An apparatus comprising:
a filter including:
two input nodes configured to:
accept a first input current associated with at least a first signal at a first time; and
accept a second input current associated with at least a second signal at a second time;
two output nodes;
two differential paths respectively coupled between the two input nodes and the two output nodes; and
filter means for providing a low-pass response to pass the first signal along the two differential paths from the two input nodes to the two output nodes at the first time and providing a band-pass response to pass the second signal along the two differential paths from the two input nodes to the two output nodes at the second time, wherein the filter means comprises:
low-pass means for providing the low-pass response;
high-pass means for providing a high-pass response, the high-pass means comprising capacitive means for providing series impedances along the two differential paths, respectively; and
inductive means for providing a shunt impedance between the two differential paths;
switch means for providing the low-pass response via the low-pass means at the first time or for providing the band-pass response via the low-pass means and the high-pass means at the second time, the switch means comprising bypass means for enabling or disabling the capacitive means; and
coupling means for enabling or disabling the inductive means.

14. The apparatus of claim 13, wherein:
the second signal comprises two non-contiguous signals;
the two input nodes are configured to accept a jammer having a frequency between frequencies of the two non-contiguous signals; and
the inductive means and the coupling means are jointly configured to cause the jammer to be attenuated relative to the two output nodes at the second time.

15. The apparatus of claim 14, wherein:
the first signal has a wide bandwidth that is greater than approximately 400 megahertz; and
the two non-contiguous signals have respective narrow bandwidths that are less than approximately 400 megahertz.

16. The apparatus of claim 13, wherein the low-pass means is configured to be coupled in series between the two input nodes and the high-pass means along the two differential paths.

17. The apparatus of claim 13, wherein the low-pass means is configured to be coupled in series between the high-pass means and the two output nodes along the two differential paths.

18. A method for current-mode filtering with switching, the method comprising:
accepting an input current at two input nodes at a first time, the input current associated with at least a first signal, the two input nodes respectively coupled to two output nodes via two differential paths;
passing the first signal along the two differential paths to the two output nodes at the first time using a low-pass response;
accepting another input current at the two input nodes at a second time, the other input current associated with at least a second signal and a jammer, the jammer having a frequency lower than a frequency of the second signal;

attenuating the jammer at the second time using a high-pass filter, the high-pass filter including two series capacitors and at least one shunt inductor, the two series capacitors respectively coupled between the two input nodes and the two output nodes, and using at least one band-pass switch coupled in series with the at least one shunt inductor; and passing the second signal along the two differential paths to the two output nodes at the second time using the band-pass response.

19. The method of claim 18, wherein:

the passing of the first signal comprises bypassing the high-pass filter, the high-pass filter being coupled in series between the two input nodes and the two output nodes; and the attenuating of the jammer and the passing of the second signal jointly comprise enabling the high-pass filter to filter the input current.

20. The method of claim 18, further comprising:

performing a fifth-generation communication operation based on the first signal being passed to the two output nodes at the first time; and performing carrier aggregation based on the second signal being passed to the two output nodes at the second time, the second signal comprising at least two non-contiguous signals.

21. The method of claim 18, further comprising:

producing a local oscillator signal having a local oscillator frequency; and downconverting radio-frequency currents to baseband using the local oscillator signal to produce the input current at the first time and the other input current at the second time.

22. An apparatus comprising:

an antenna; and a receiver including:
 a low-noise amplifier coupled to the antenna;
 a mixer coupled to the low-noise amplifier;
 an analog-to-digital converter; and
 a filter including two input nodes coupled to the mixer and two output nodes coupled to the analog-to-digital converter, the filter configured to have a low-pass response at a first time and a band-pass response at a second time, the filter comprising a high-pass filter having a high-pass response, the high-pass filter comprising two series capacitors and at least one shunt inductor, the two series capacitors respectively coupled between the two input nodes and the two output nodes.

23. The apparatus of claim 22, wherein:

the antenna is configured to:
 receive at least a first signal at the first time and at least a second signal at the second time; and
 provide differential currents associated with the first signal at the first time and with the second signal at the second time;

the low-noise amplifier is configured to amplify the differential currents;

the mixer is configured to downconvert the differential currents from a radio frequency to a baseband frequency;

the filter is configured to pass, based on the differential currents, the first signal and the second signal to the analog-to-digital converter at the first time and the second time, respectively; and the analog-to-digital converter is configured to:
 digitize the first signal at the first time; and
 digitize the second signal at the second time.

24. The apparatus of claim 23, wherein:

the first signal comprises at least one narrowband signal or at least one wideband signal; and the second signal comprises at least one narrowband signal having a center frequency that is offset relative to a center frequency of the first signal.

25. The apparatus of claim 22, wherein the filter includes:

a high-pass filter having a high-pass response;

a low-pass filter having the low-pass response, the low-pass filter coupled in series with the high-pass filter between the two input nodes and the two output nodes; and switch circuitry configured to:
 bypass the high-pass filter to cause the filter to have the low-pass response at the first time; and
 engage the high-pass filter to cause the filter to have the band-pass response at the second time, the band-pass response comprising a superposition of the low-pass response and the high-pass response.

26. The apparatus of claim 25, wherein:

the low-pass filter includes active components; and the low-pass filter is configured to be coupled between the high-pass filter and the two output nodes.

27. The apparatus of claim 25, wherein:

the low-pass filter includes passive components; and the low-pass filter is configured to be coupled between the input nodes and the high-pass filter.

28. The apparatus of claim 22, wherein the filter includes a current buffer configured to match an impedance of the filter to an impedance of the analog-to-digital converter.

* * * * *